(12) United States Patent
Zhu et al.

(10) Patent No.: US 7,326,997 B2
(45) Date of Patent: Feb. 5, 2008

(54) METHOD AND STRUCTURE FOR ENHANCING BOTH NMOSFET AND PMOSFET PERFORMANCE WITH A STRESSED FILM

(75) Inventors: Huilong Zhu, Poughkeepsie, NY (US); Jing Wang, Beacon, NY (US); Bruce B. Doris, Brewster, NY (US); Zhibin Ren, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/561,047

(22) Filed: Nov. 17, 2006

(65) Prior Publication Data

US 2007/0120197 A1    May 31, 2007

Related U.S. Application Data

(63) Continuation of application No. 11/164,224, filed on Nov. 15, 2005, now Pat. No. 7,183,613.

(51) Int. Cl.
*H01L 27/01* (2006.01)

(52) U.S. Cl. ............... 257/351; 257/200; 257/192; 257/E29.193

(58) Field of Classification Search ............... 257/18, 257/19, 192, 200, 347, 351, E29.193
See application file for complete search history.

(56) References Cited

U.S. PATENT DOCUMENTS 6,600,170 B1 * 7/2003 Xiang ................ 257/18

* cited by examiner

*Primary Examiner*—Thomas Dickey
*Assistant Examiner*—Scott R. Wilson
(74) *Attorney, Agent, or Firm*—Todd M. C. Li

(57) ABSTRACT

A structure and method for making includes adjacent pMOSFET and nMOSFET devices in which the gate stacks are each overlain by a stressing layer that provides compressive stress in the channel of the pMOSFET device and tensile stress in the channel of the nMOSFET device. One of the pMOSFET or nMOSFET device has a height shorter than that of the other adjacent device, and the shorter of the two devices is delineated by a discontinuity or opening in the stressing layer overlying the shorter device. In a preferred method for forming the devices a single stressing layer is formed over gate stacks having different heights to form a first type stress in the substrate under the gate stacks, and forming an opening in the stressing layer at a distance from the shorter gate stack so that a second type stress is formed under the shorter gate stack.

5 Claims, 13 Drawing Sheets

US 7,326,997 B2

METHOD AND STRUCTURE FOR ENHANCING BOTH NMOSFET AND PMOSFET PERFORMANCE WITH A STRESSED FILM

BACKGROUND

This patent application is a Continuation patent application of U.S. patent application Ser. No. 11/164,224, filed on Nov. 15, 2005 U.S. Pat. No. 7,183,613.

The present invention relates generally to semiconductor device processing techniques, and, more particularly, to a method and structure for improving CMOS device performance and reliability by using single stress liner instead of dual stress liner.

More recently, dual stress liner (DSL) techniques have been introduced in order to provide different stresses in P-type MOSFET devices with respect to N-type MOSFET devices. For example, a nitride liner of a first type is formed over pMOSFETs of a CMOS device, while a nitride liner of a second type is formed over the nMOSFETs of the CMOS device. More specifically, it has been discovered that the application of a compressive stress in a pMOSFET channel in the direction of the electrical current improves carrier, hole, mobility therein, while the application of a tensile stress in an nMOSFET channel improves carrier, electron, mobility therein. Thus, the first type nitride liner over the pMOSFET devices is formed in a manner so as to achieve a compressive stress, while the second type nitride liner over the nMOSFET devices is formed in a manner so as to achieve a tensile stress.

For such CMOS devices employing dual liners, the conventional approach has been to form the two different nitrides using separate lithographic patterning steps. In other words, for example, the first type nitride liner is formed over both pMOSFET and nMOSFET devices, with the portions of the first type nitride liner over the nMOSFET devices being thereafter patterned and removed. After an optional formation of an oxide layer, the second type nitride liner is formed over both regions, with a second patterning step being used to subsequently remove the portions of the second type nitride liner over the pMOFET devices. Unfortunately, due to inherent inaccuracies associated with aligning lithographic levels to previous levels, the formation of the two liners could result in a gap or underlap there between. In particular, this gap will cause problems for subsequent etching of holes for metal contact vias since, during the etching, the silicide in the underlap/gap areas will be over etched. This in turn will increase sheet resistance of the silicide.

On the other hand, the two liners could also be formed in a manner such that one liner overlaps the other. In fact, the reticles used for the two separate patterning steps are typically designed to ensure an overlap such that there is no gap between the two liner materials. However, having certain regions with overlapping nitride liners creates other problems with subsequent processing due to issues such as reliability and layout inefficiencies. For example, a reactive ion etch (RIE) process for subsequent contact formation may have to accommodate for a single-thickness liner in some areas of the circuit, while also accommodating for a double-thickness (overlapping) liner in the interface areas. Moreover, if such overlapping areas are excluded from contact formation, a restriction results in terms of available layout area and critical dimension (CD) tolerances. The overlap will also cause problems during subsequent etching of holes for metal contact vias since, during the etching, all of the silicide will be over etched except for the silicide under the overlap areas. This can increase sheet resistance and junction leakage of devices.

Accordingly, it would be desirable to be able to implement the formation of a stressed CMOS device in a manner that avoids the problems discussed above related to misalignment of dual stress liners.

SUMMARY

The foregoing discussed drawbacks and deficiencies of the prior art are overcome or alleviated by a method for forming a single stress liner for a complementary metal oxide semiconductor (CMOS) device. In an exemplary embodiment, the method includes: 1) forming a CMOS structure having an nMOSFET and pMOSFET with different gate heights (for example, the nMOSFET gate may be lower than the gate of the pMOSFET, or vice versa), 2) depositing a single stress liner of a either compressive or tensile stress over both the nMOSFET and pMOSFET; and 3) etching part of the stress liner close to the shorter of the gates to form stress of the opposite type in the channel of the shorter gate. For example, if a compressive stress liner is first formed, and the shorter gate is the nMOSFET, then etching part of the compress stress liner in proximity to the nMOSFET will result in tensile stress in the channel of the nMOSFET. If the shorter gate is the pMOSFET, then according to the invention, a tensile stress liner is deposited over both gates, and part of the stress liner is removed around the shorter pMOSFET, resulting in compressive stress in the channel of the pMOSFET.

BRIEF DESCRIPTION OF THE DRAWINGS

Referring to the exemplary drawings wherein like elements are numbered alike in the several Figures.

DETAILED DESCRIPTION

Disclosed herein is a method and structure for improving CMOS device performance and reliability by using single stress silicon nitride liner for both nMOSFET and pMOSFET. Briefly stated, the embodiments disclosed herein result in compressive stress in the pMOSFET channel and tensile stress in the nMOSFET channel on the same chip or integrated circuit (IC) by using the same stressed film to cover both the pMOSFET and the nMOSFET. This results in performance enhancement due to local stress for both nMOSFET and pMOSFET, without causing misalignment problems.

Figure 1:
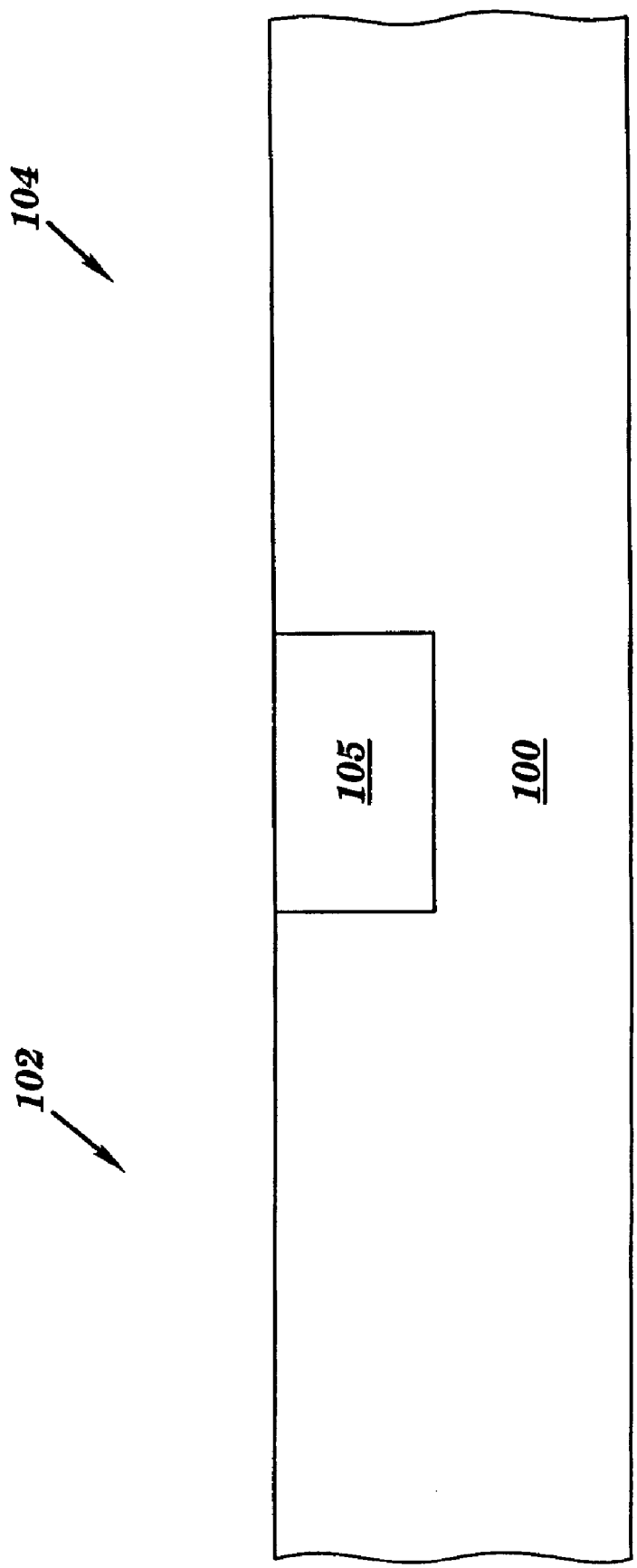
FIGS. 1 through 10 illustrate steps of an exemplary process flow for forming an nMOSFET and a pMOSFET, wherein one gate stack is shorter in height than the other, in accordance with an embodiment of the invention.

Referring initially to FIG. 1, there is shown a cross sectional view of a semiconductor substrate 100 having an nMOSFET device region 102 and a pMOSFET device region 104 separated by an isolation region 105 formed therein, such as a shallow trench isolation (STI).

Figure 2:
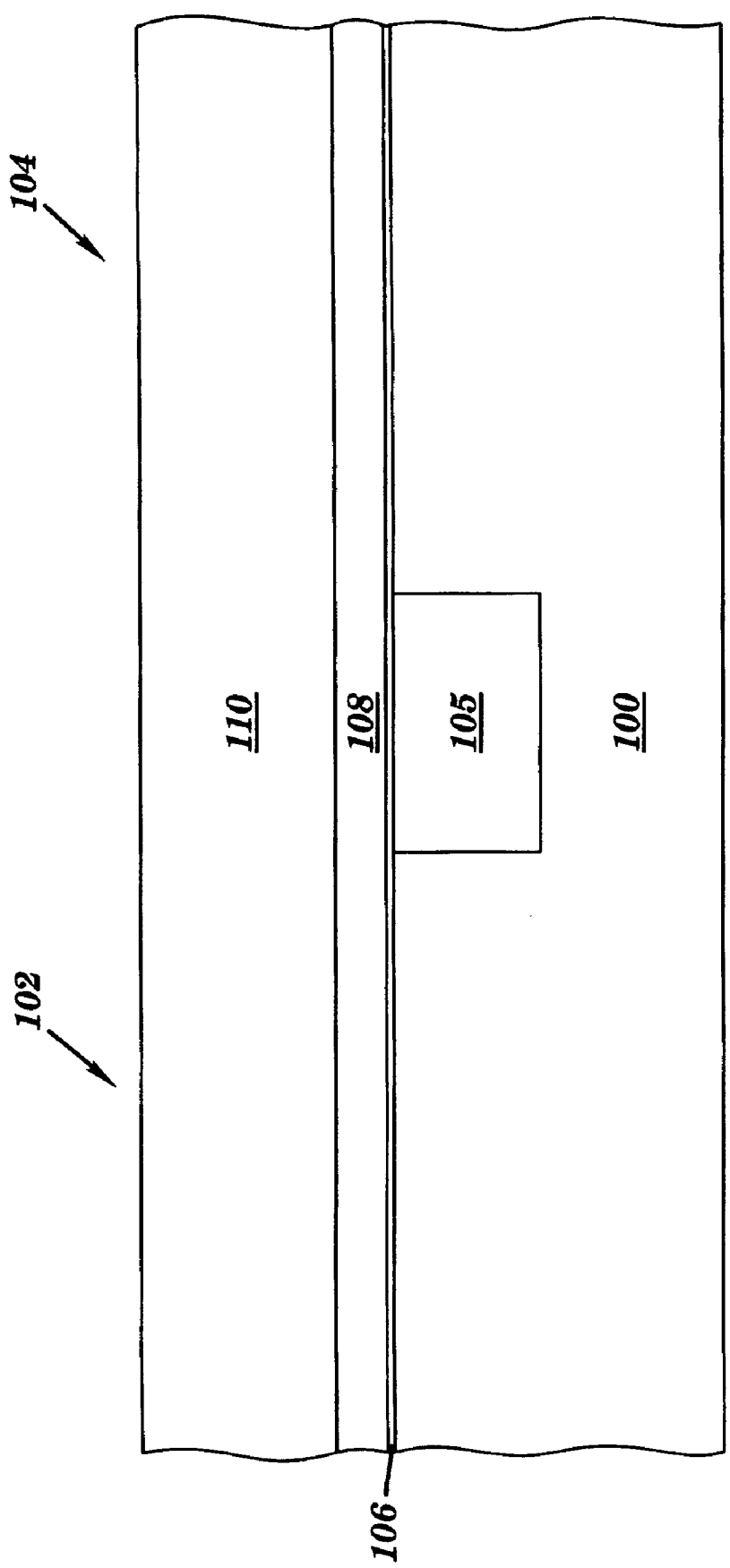

Referring to FIG. 2, a gate dielectric layer 106 is formed over the substrate 100 including the isolation region 105. The gate dielectric 106 may be any suitable dielectric material, such as silicon dioxide. The gate dielectric 106 may be formed, for example, by thermal oxidation or deposition of a high K material. The gate dielectric 106 typically has a thickness in the range of about 1-2 nm. In accordance with the invention, a first layer of a gate conductor 108 is formed atop the gate dielectric layer 106. The first gate conductor layer 108 may be any suitable gate conductor material such as polysilicon, W, Ta or SiGe, more typically polysilicon. For gate lengths of 35-45 nm, the polysilicon layer 108 is preferably 10-30 nm thick. A second gate conductor layer 110 having an etch rate different than the first gate conductor layer 108, such as polysilicon-germanium (poly-SiGe), if the first conductor layer is polysilicon, is deposited atop the first gate conductor (e.g. polysilicon) layer 108. For gate lengths of 35-45 nm, the poly-SiGe layer 110 is preferably 70-90 nm thick. Preferably, the second gate conductor layer 110 is thicker than the first conductor layer 108.

Figure 3:
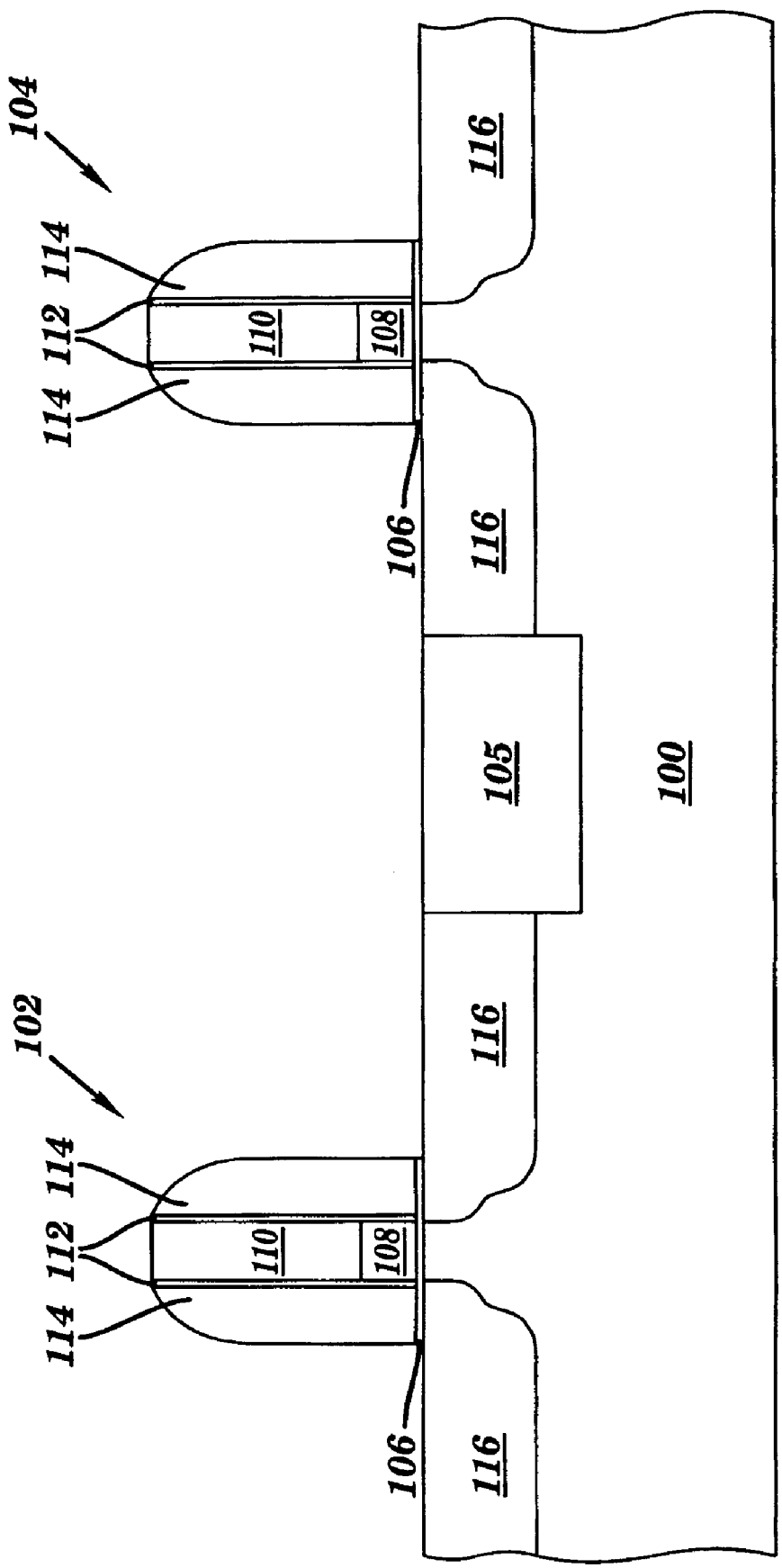

Referring to FIG. 3, devices 102, 104 are formed by processes now known or developed in the future. For example, the gate stacks may be formed by patterned etching, formation of spacers including optional thin oxide liners 112 and nitride spacers 114, and implantation to form source/drain halo regions and extensions 116, followed by source/drain anneal, as will be recognized by one skilled in the art.

Figure 4:
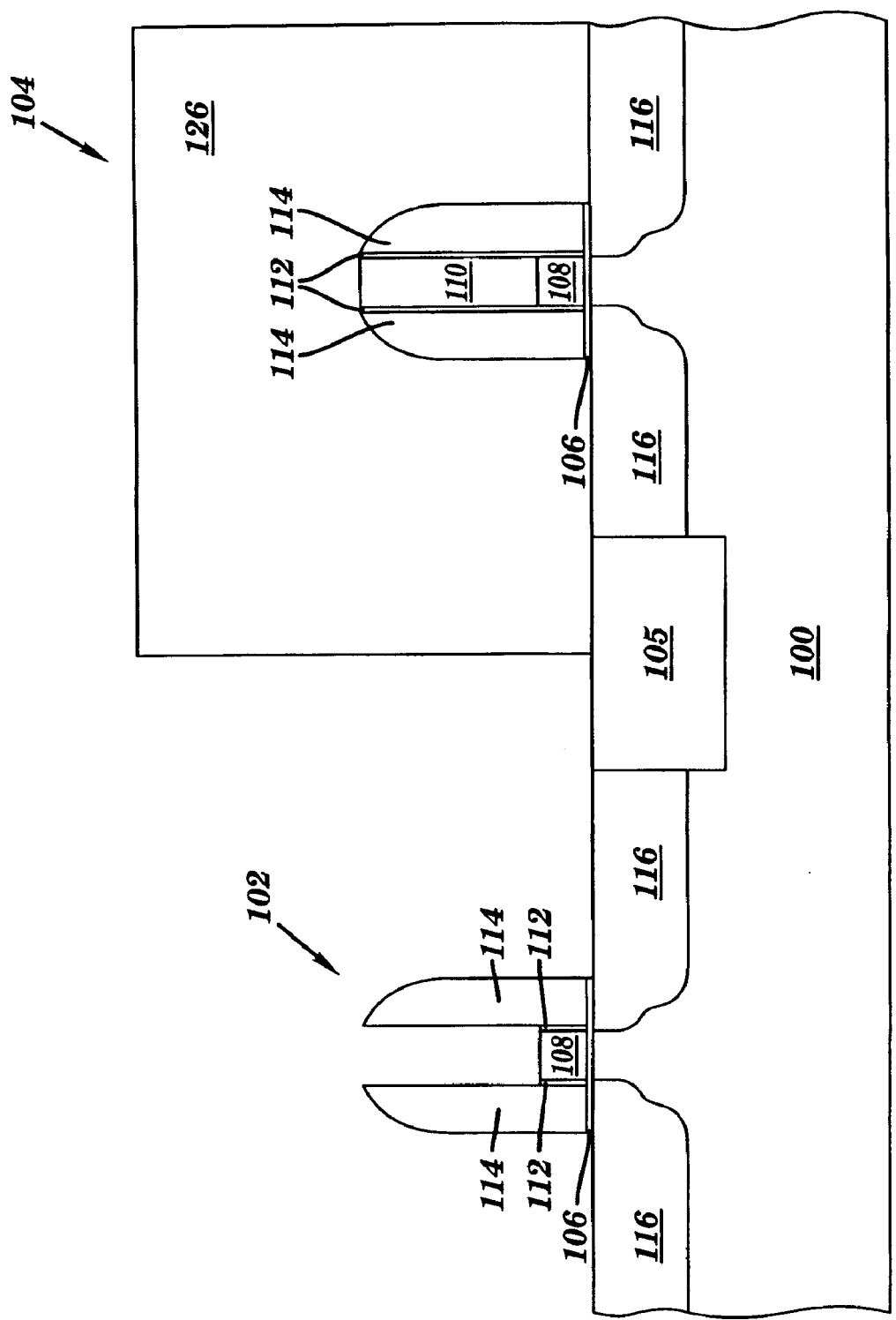

Referring to FIG. 4, the pMOSFET 104 is covered by a mask such as photo resist layer 126. Then, the second gate conductor layer 110, e.g. the poly-SiGe layer, is removed from the first gate conductor layer 108 in the nMOSFET 102, for example, by an etch process selective to silicon, poly Is, oxide and nitride. Then the exposed oxide liner 112 above the first gate conductor 108 is removed from the sidewalls 114 of the nMOSFET 102, for example, using a process such as buffered HF (BHF). Etch time will depend on the thickness of the oxide liner 112. Since the oxide liner 112 is very thin, for example, on the order of about 5-10 nm, there will be no significant damage to the isolation region 105.

Figure 5:
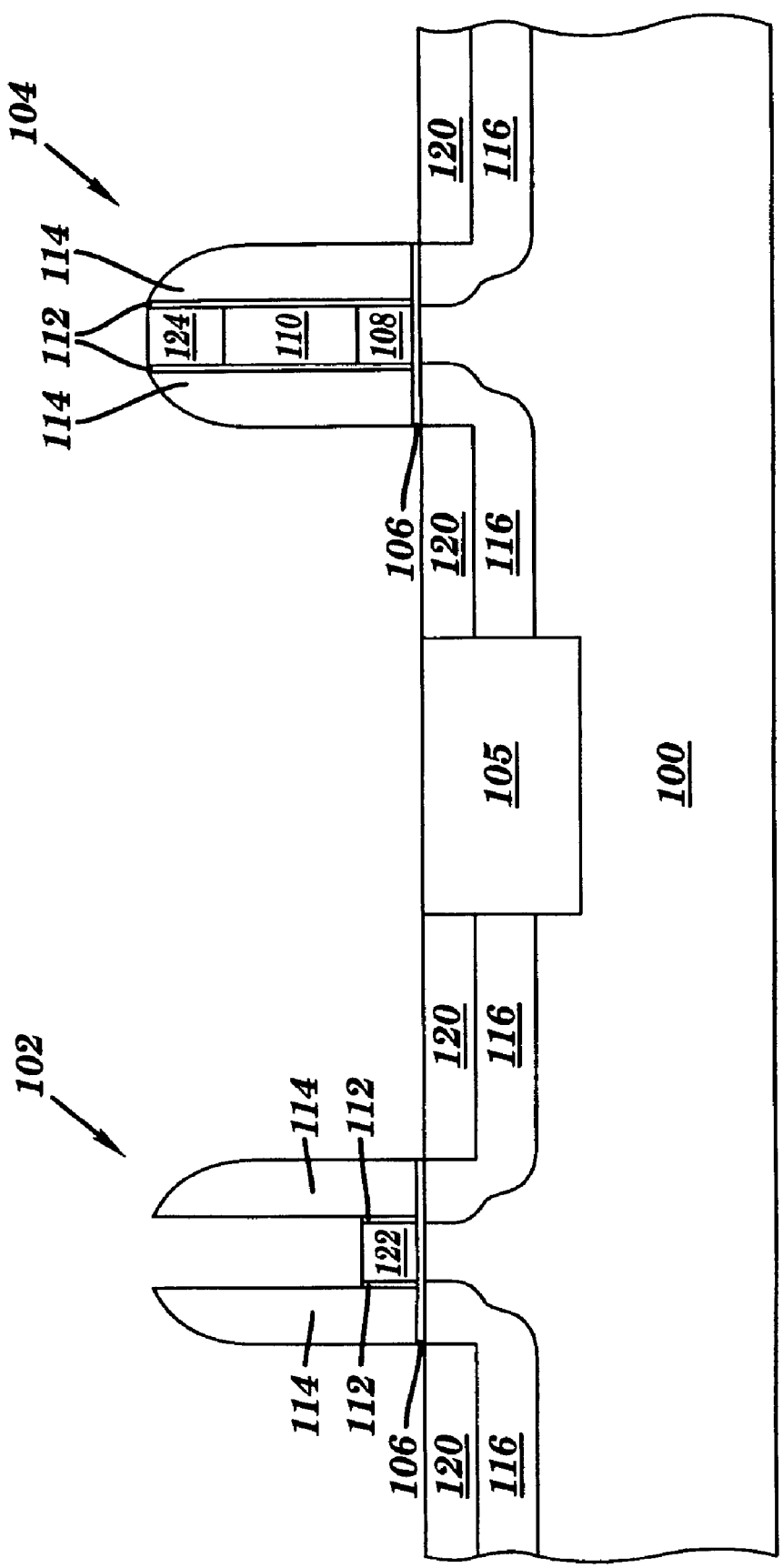

Referring to FIG. 5, the photo resist 126 is removed. Then, a metal layer is deposited over the structure. For example, in a preferred embodiment, nickel is deposited at a thickness between about 3-20 nm, sufficient to fully silicide the polysilicon layer 108 in the nMOSFET gate stack 102. After an anneal, for example, at 300-500° C. at 1-60 seconds, a semiconductor metal alloy is formed from the metal and the silicon of the nMOSFET gate stack 102, the silicon of the substrate 100, and the SiGe of the pMOSFET gate stack 104. The resulting structure includes silicide regions 120 over the source/drain regions 116, a fully silicided gate conductor 122 in the nMOSFET 102, and a silicided top portion 124 of the pMOSFET 104.

Figure 6:
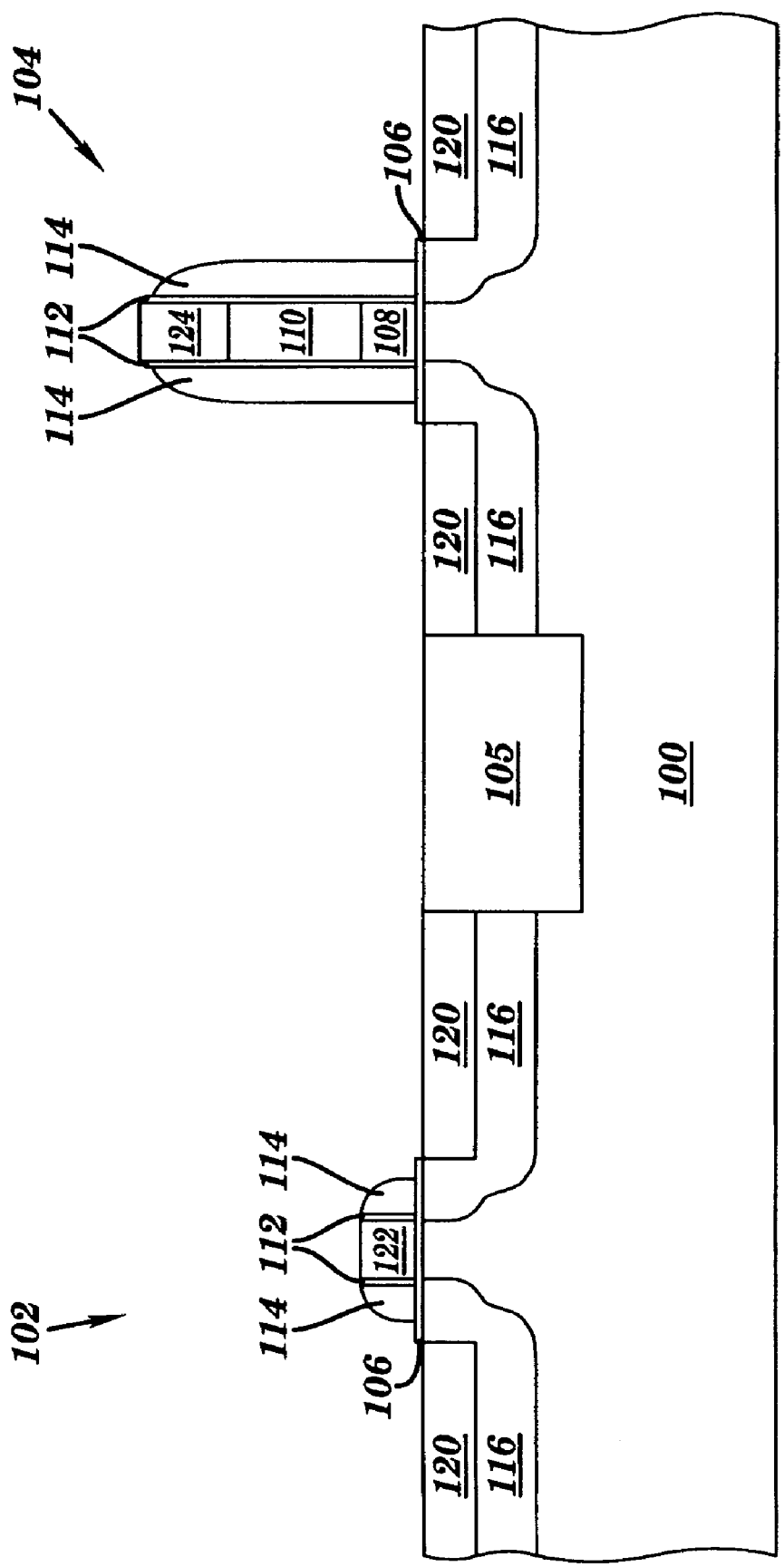

Next, referring to FIG. 6, the nitride spacers 114 are etched back, for example by a wet etch or dry etch process, so that the nitride spacers 114 have substantially the same height as the silicided gate conductor 122 and oxide liner 112 of the nMOSFET 102, resulting in an nMOSFET gate stack 102 that is shorter in height than the pMOSFET gate stack 104. Since a wet etch process is isotropic, the nitride spacers 114 on the pMOSFET 104 will be thinned. Preferably, the nitride spacers 114 are thinned no more than about half its original thickness.

Figure 7:
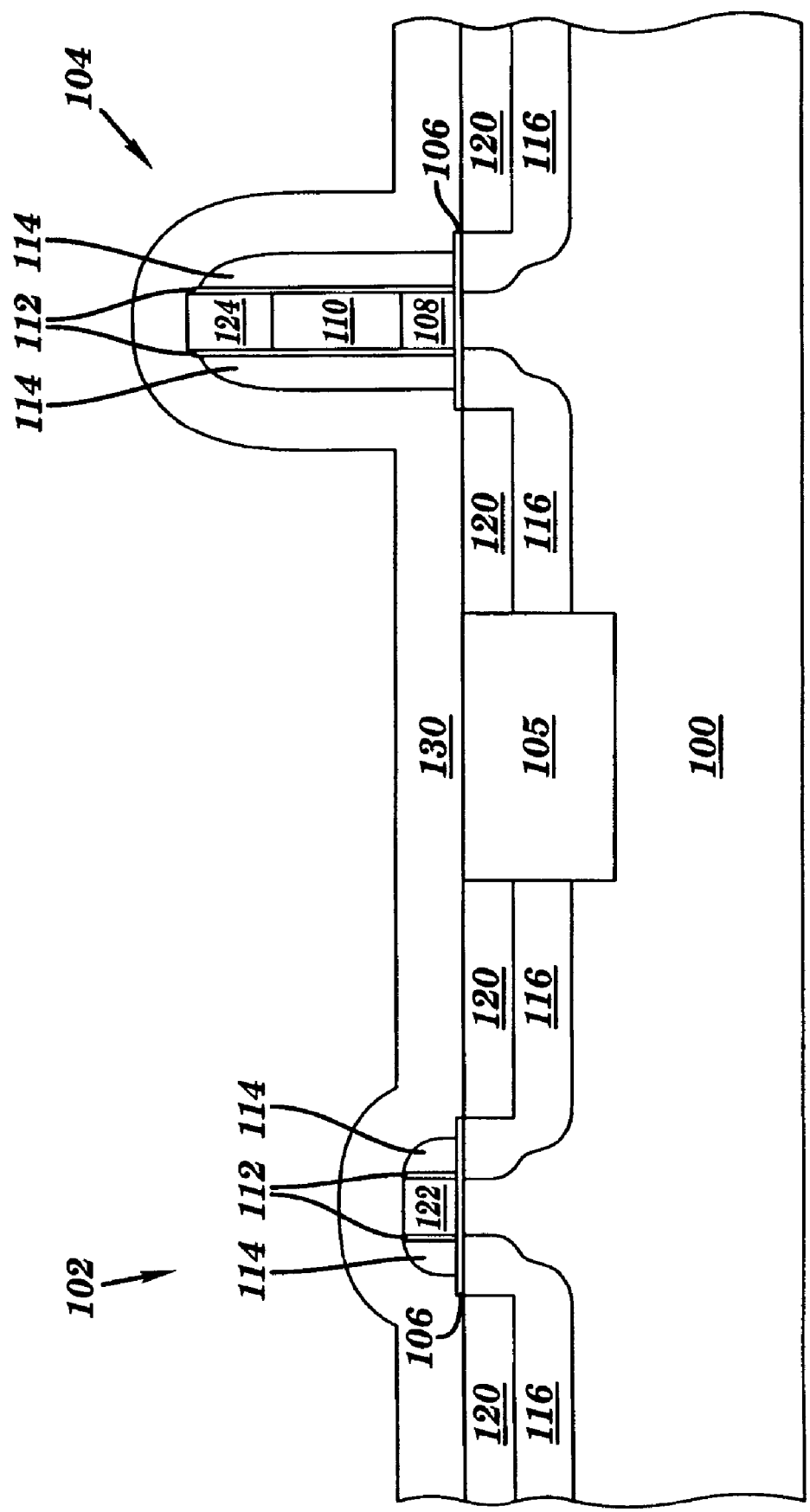

Referring to FIG. 7, a compressive nitride film 130 is deposited over the structure. The thickness of the compressive nitride film is preferably in the range 40-100 nm. The compressive nitride material 130 may be formed by high density plasma (HDP) deposition or plasma enhanced CVD (PECVD), for example, $SiH_4/NH_3/N_2$ at about 200° C. to about 500° C. This results in compressive stress being generated in the channels 182, 184 of the nMOSFET and pMOSFET regions 102, 104, respectively (see FIG. 8).

Figure 8:
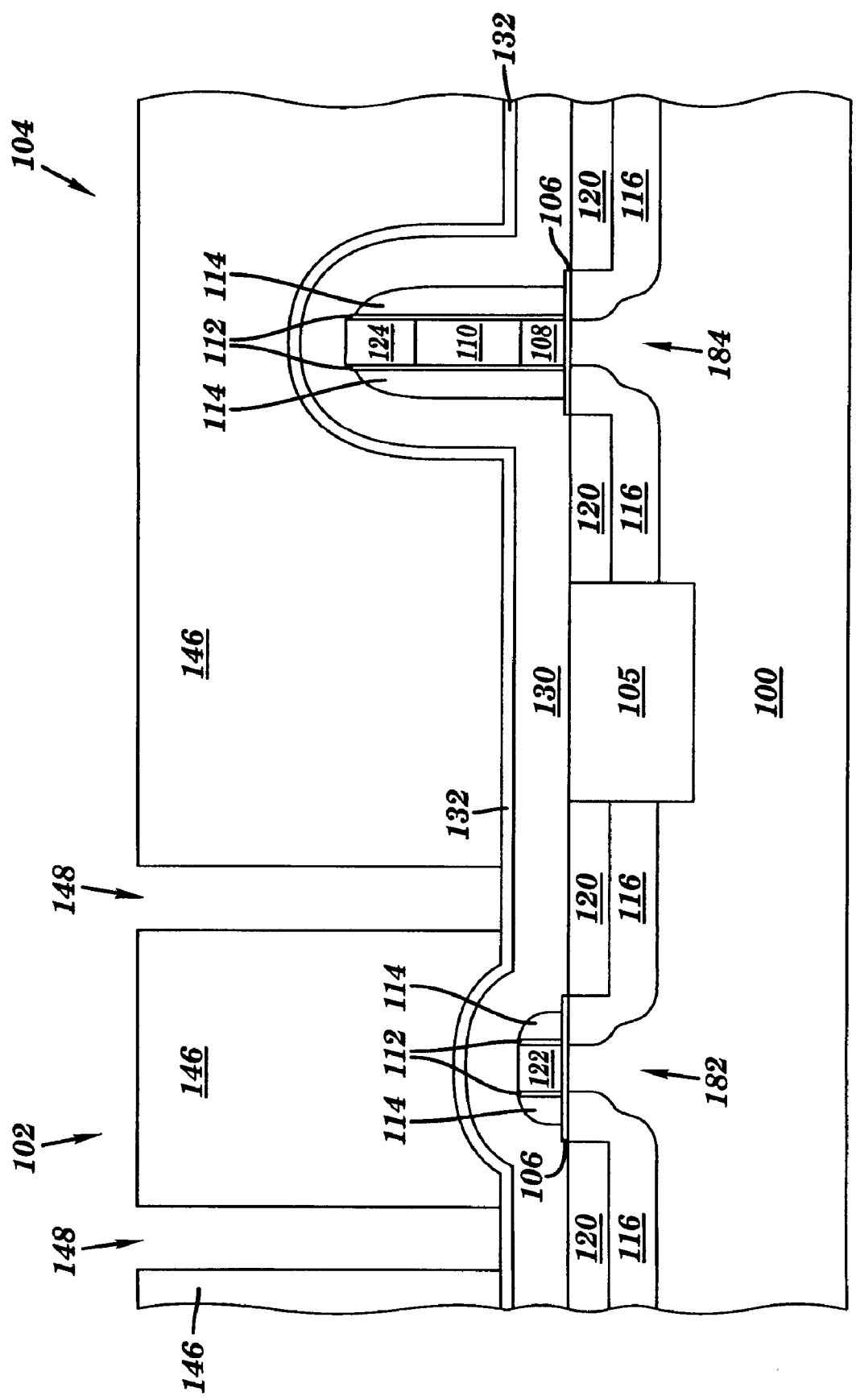
Figure 9:
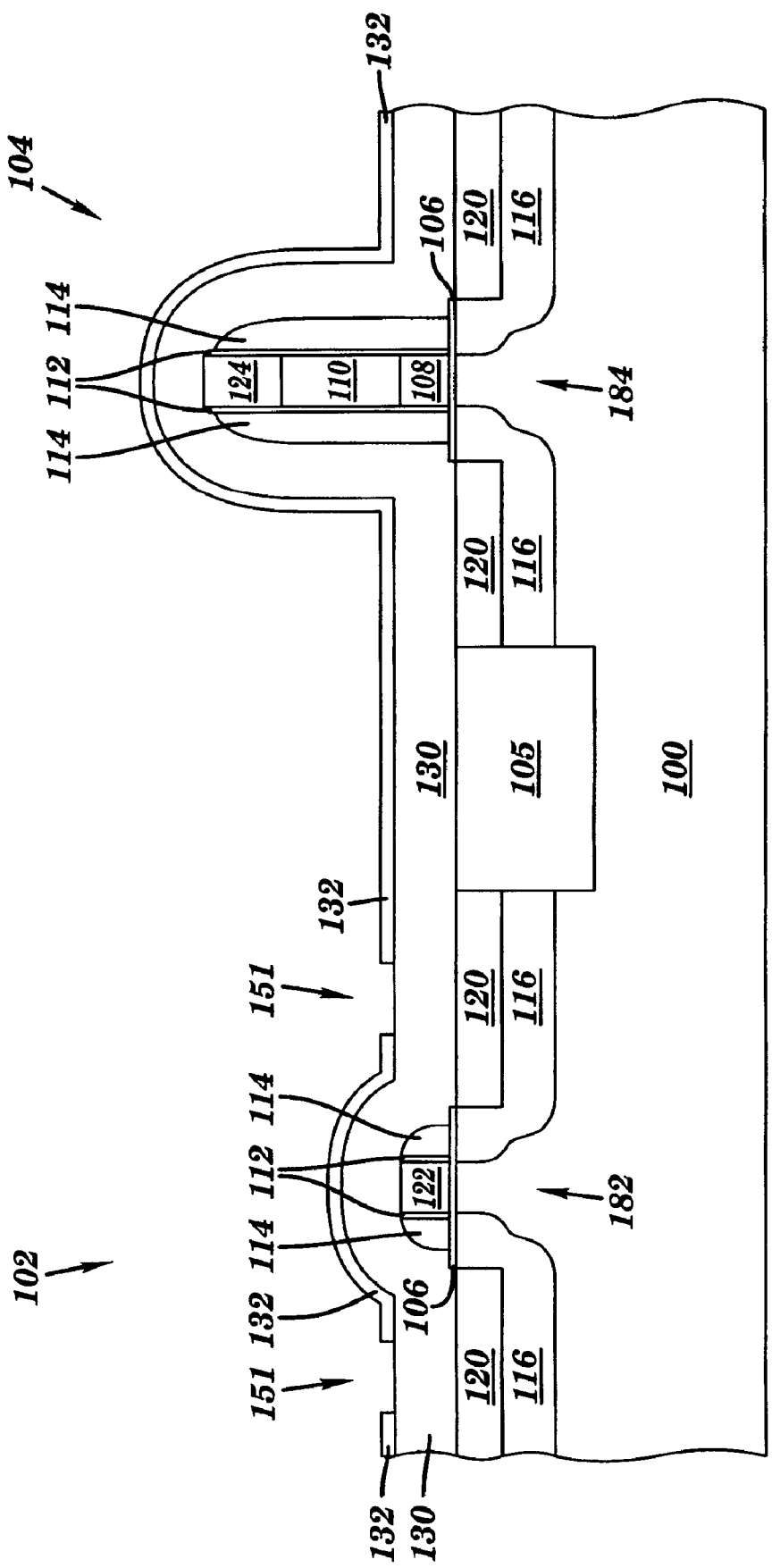

Next, referring to FIG. 8, a thin etch stop layer 132, such as an oxide, for example, about 50-100 angstroms thick, is formed atop the compressive nitride layer 130. Then, a photo resist material 146 is formed over the structure and thereafter patterned so as to form openings 148 in the resist 146 that expose the surface of the thin oxide 132 on at least opposite sides of the nMOSFET 102 over the source/drain regions 116, which will be used to pattern openings 158 in the compressive nitride layer 130 (see FIG. 10). For a sufficiently narrow width device, forming the opening 158 completely around the perimeter of the gate 122 in the compressive layer 130 may enhance device performance. However, for a wide width device, the additional benefit caused by surrounding the device by openings 158 is small, and it would be sufficient to form openings 158 on opposite sides of the shorter device 102. The exposed portion of the thin oxide layer 132 above the nMOSFET device 102 is removed to form openings 151 in the thin oxide 132, using a process such as by RIE for example, stopping on the compressive nitride layer 130. Then the resist layer 146 is removed. The resulting structure is illustrated in FIG. 9.

Figure 10:
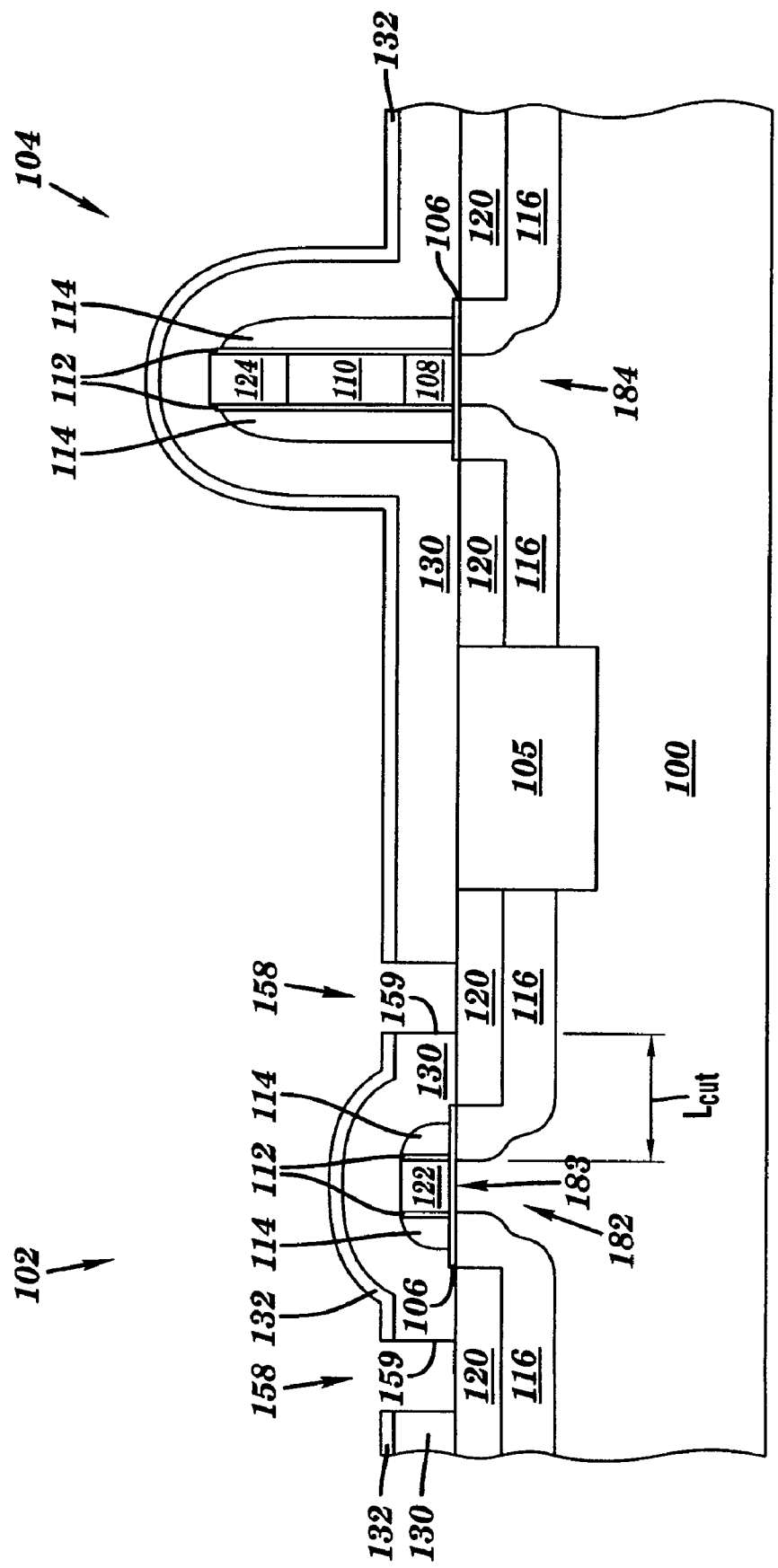

Next, the compressive nitride layer 130 is removed, for example, by an isotropic or wet etch, where the openings 151 in the thin oxide 132 has been formed over the source/drain regions 116 of the nMOSFET device 102, to form openings 158 so that an inner edge 159 of the opening 158 is at a horizontal distance Lcut from the outer edge of the gate conductor 122, so that the stress of the channel region 182 of the nMOSFET device 102 is modified to become tensile stress. The resulting structure is illustrated in FIG. 10. It is noted that the width of the opening 158 may be from about 30 nm to about 100 nm, but is not critical, and that the edge of the opening 158 away from the gate stack may extend as far as the isolation region 105.

Figure 11:
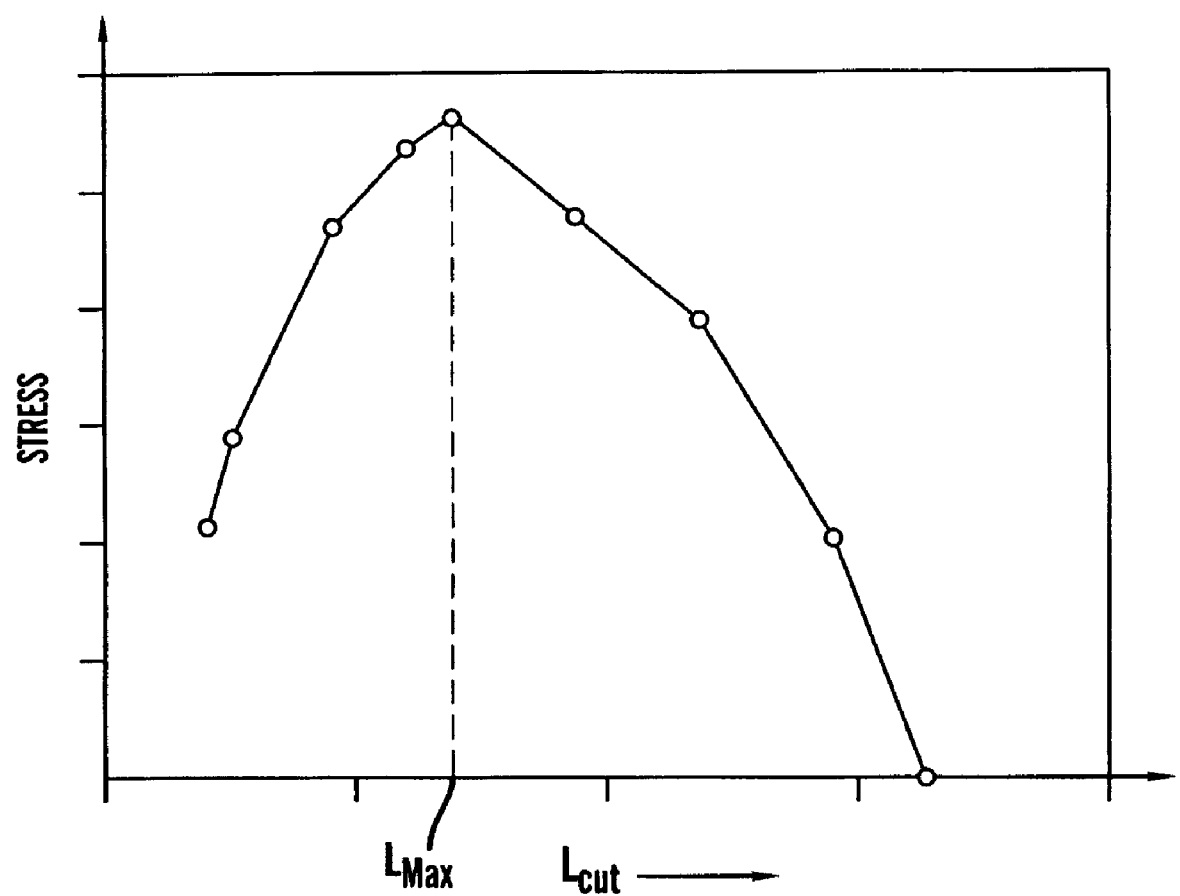
FIG. 11 illustrates a plot of stress as a function of horizontal distance Lcut from the gate conductor having a shorter height to the edge of the opening in the stressing layer formed in accordance with the invention.

The preferred horizontal distance Lcut of the opening 158 from the gate conductor 122 is preferably selected so as to optimize the resulting stress in the channel region 182. This optimal distance $L_{Max}$ can be determined, for example, by simulating the stress at the center 183 of the channel region 182 for a range of expected gate structures similar to that of nMOSFET device 102, but varying the Lcut distance, and then determining the position of Lcut (i.e. $L_{Max}$) to be such that the channel stress is the maximized, as illustrated in FIG. 11. For the case of a pMOSFET that is shorter than the nMOSFET, the initial stressing layer 130 is tensile, and the value of Lcut is preferably chosen at $L_{Max}$ to maximize the compressive stress in the pMOSFET channel.

Figure 12:
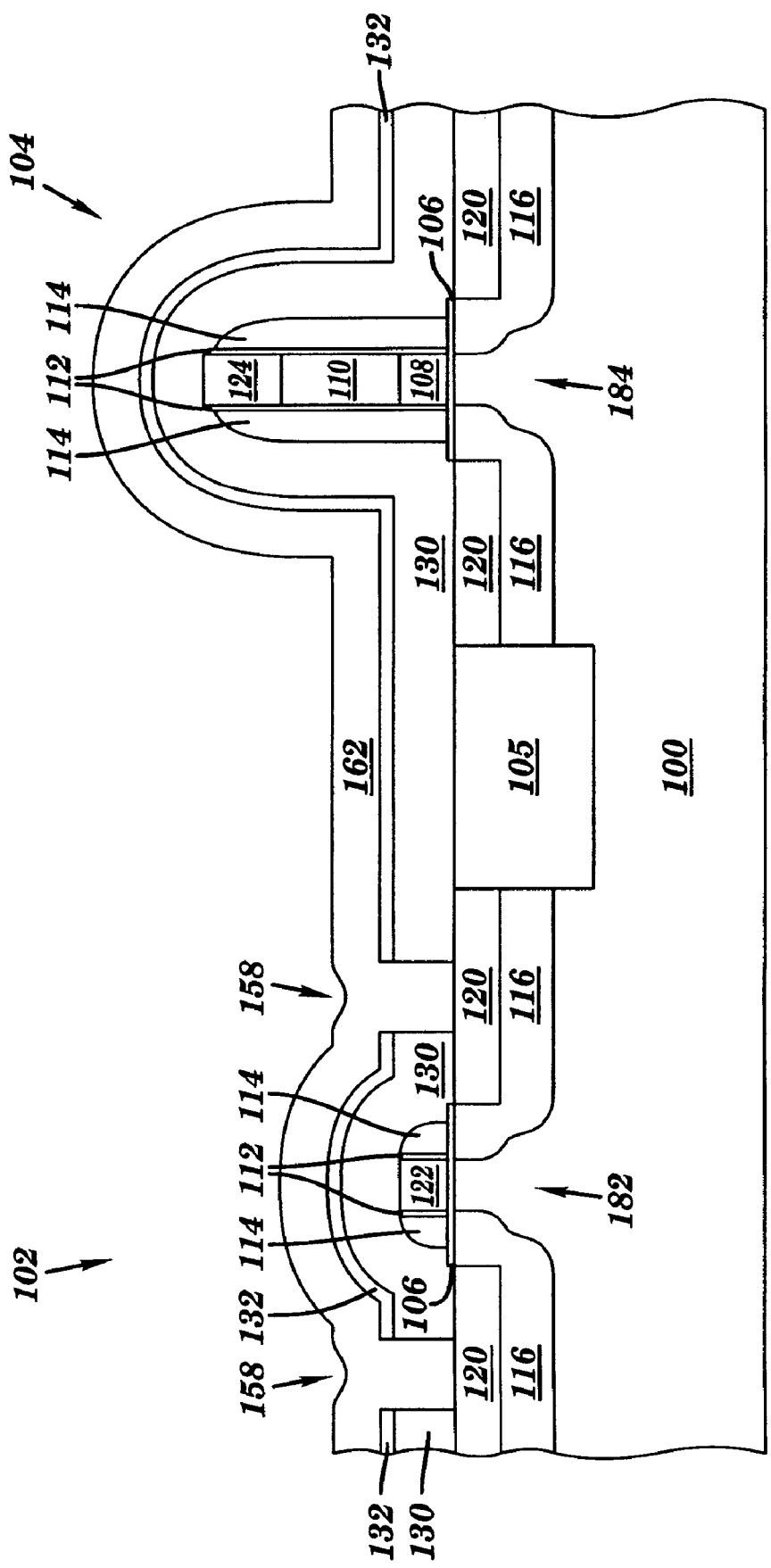
FIGS. 12 through 13 illustrate additional steps subsequent to FIG. 10 of an exemplary process flow for forming an nMOSFET and a pMOSFET, wherein one gate stack is shorter in height than the other, in accordance with an embodiment of the invention.
Figure 13:
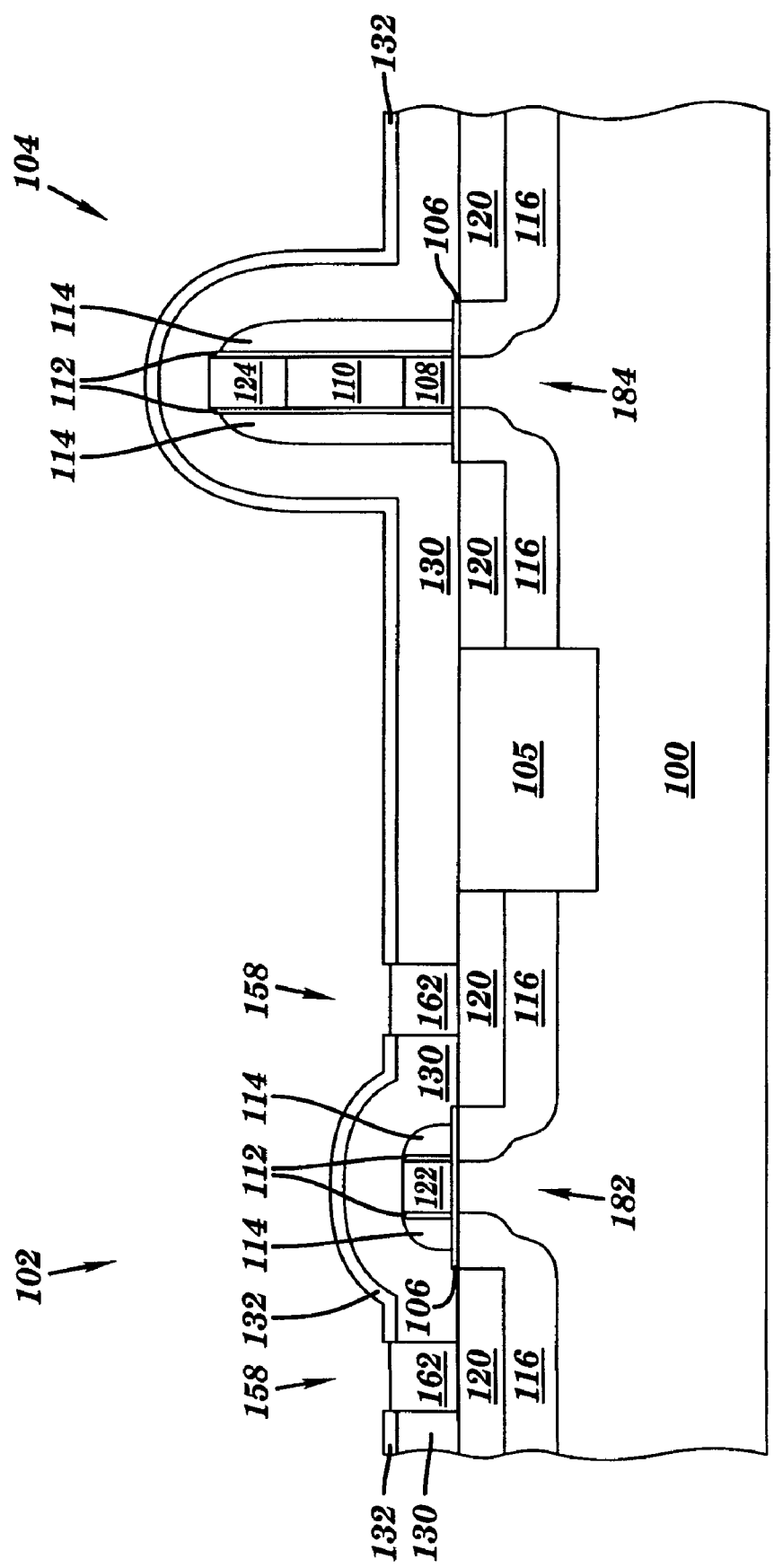

Next, a nitride film 162 having substantially neutral stress, or substantially without a large stress component is deposited over the structure, for example, by chemical vapor deposition (CVD) or high density plasma (HDP), so that the openings 158 are filled in the compressive nitride layer 130, as illustrated in FIG. 12. Preferably the thickness of the neutral stress layer 162 should be greater than ½ of the width of the opening 158. Then the neutral stress layer 162 is etched back to a surface that is substantially level with the surface of the thin oxide layer 132, as illustrated in FIG. 13.

Subsequently, the nMOSFET device 102 and pMOSFET device 104 may be completed as known by one skilled in the art.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor structure comprising:
    a first MOSFET device of a first type including a first gate conductor stack of first height over a first channel region, said first channel region under stress of a first type, wherein said first gate stack is overlain by a first stressing layer causing said stress of a first type; and
    a second MOSFET device of a second type including a second gate conductor stack over a second channel region, said second gate stack having a height less than said first height, and a second channel region under said second gate stack under stress of a second type, wherein said second gate stack is overlain by a second stressing layer causing a stress of a second type different than said stress of said first type, wherein said second stressing layer is delimited by at least one discontinuity in said second stressing layer adjacent said second gate conductor, said discontinuity separating said second stressing layer from said first stressing layer, and wherein said first stressing layer and said second stressing layer are non-overlapping and
    wherein said at least one discontinuity comprises an opening between said first stressing layer and said second stressing layer, said opening formed completely around the perimeter of said second gate stack.

2. The semiconductor structure of claim 1 wherein said second stressing layer and said first stressing layer consist of substantially the same composition.

3. The semiconductor structure of claim 1 wherein said at least one discontinuity comprises at least one spacing between said second stressing layer and said first stressing layer, and wherein said at least one spacing is filled with a substantially neutral stress material.

4. The semiconductor structure of claim 1 wherein said first type of MOSFET device is a pMOSFET and said stress of a first type is compressive and wherein said second type of MOSFET device is an nMOSFET and said stress of a second type is tensile.

5. The semiconductor structure of claim 1 wherein said first type of MOSFET device is an nMOSFET and said stress of a first type is tensile and wherein said second type of MOSFET device is an pMOSFET and said stress of a second type is compressive.

* * * * *